(12) United States Patent
Nishinaga

(10) Patent No.: US 6,338,755 B1
(45) Date of Patent: Jan. 15, 2002

(54) METHOD FOR PRODUCING A SINGLE CRYSTALLINE MEMBER

(75) Inventor: Tatau Nishinaga, Kashiwa (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 09/566,978

(22) Filed: May 9, 2000

(30) Foreign Application Priority Data

Jul. 8, 1999 (JP) .............................................. 11-193953

(51) Int. Cl.⁷ .............................................. C30B 11/14
(52) U.S. Cl. .............................. 117/81; 117/63; 117/60; 117/75; 117/82; 117/83
(58) Field of Search .............................. 117/75, 60, 81, 117/82, 83, 63

(56) References Cited

U.S. PATENT DOCUMENTS

| | | | | |
|---|---|---|---|---|
| 4,066,482 A | * | 1/1978 | Shaw ........................... | 117/63 |
| 4,690,726 A | * | 9/1987 | Luther et al. .................. | 117/60 |
| 5,064,497 A | * | 11/1991 | Clemans ....................... | 117/81 |
| 5,702,822 A | * | 12/1997 | Terui et al. .................... | 117/75 |

FOREIGN PATENT DOCUMENTS

JP          57-76821 A    *   5/1982   .................. 117/60

* cited by examiner

*Primary Examiner*—Robert Kunemund
(74) *Attorney, Agent, or Firm*—Stevens, Davis, Miller & Mosher, LLP

(57) ABSTRACT

An amorphous film 2 is formed on a single crystalline substrate 1. Then, the amorphous film is selectively removed by photolithography to form windows 3. Subsequently, the windows 3 are contacted with a supersaturated solution 5 dissolving a given element in supersaturation and thereby, single crystals containing the given element as a constituting element are epitaxially grown in a perpendicular direction to a surface of the single crystalline substrate from the windows. Then, after a given time elapsed, the epitaxial growth is stopped by finishing the contact of the windows with the supersaturated solution 5 and single crystalline members 6 having given sizes and shapes are obtained.

10 Claims, 3 Drawing Sheets

METHOD FOR PRODUCING A SINGLE CRYSTALLINE MEMBER

BACKGROUND OF THE INVENTION

1. Field of the Invention

This invention relates a method for producing a single crystalline member, and more particularly a method for producing a single crystalline member preferably usable for a semiconductor- and an oxide-single crystalline substrate.

2. Description of the Prior Art

Single crystalline substrates made of semiconductor materials or oxide materials are used for devices such as a silicon integrated circuit, an optical device, an electronic device and a solar battery.

These substrates have been produced as follows: Large single crystals made of semiconductor material or oxide material are grown by a crystal pulling method (Czochralski method), a horizontal/vertical Bridgman method or a floating zone-melting method, and thereafter, are cut out to given sizes by a mechanical method using a crystal-cutting machine, etc.

Moreover, in employing the thus obtained single crystalline substrate for an electronic/optical device, its surface should be mirror-polished.

However, as the diameter of the single crystal become large, a machine to cut it also become large and complex. Moreover, the single crystal itself is required to have a mechanical strength to endure the above cutting process, so that it is required to have a large thickness. Thus, the above conventional method does not enable the single crystal to have sufficient utilizing efficiency for the device fabrication.

Furthermore, since a large shearing stress acts on the single crystalline substrate at the cutting, the part of the single crystalline substrate is often lost or a deep fractured layer is often formed at the cutting surface.

Moreover, for using the single crystalline substrate for the electronic/optical device, the minor polishing is essential to the substrate, so that it need many processing steps.

SUMMARY OF THE INVENTION

It is an object of the present invention to provide a new producing method of a single crystalline member in which a single crystalline member usable for a single crystalline substrate can be directly obtained without the above cutting process and polishing process.

To iron out the above problems, this invention relates to a method for producing a single crystalline member, comprising the steps of:

preparing a single crystalline substrate, forming a seed crystal part on a surface of the single crystalline substrate, and contacting the seed crystal part with a solution containing a given element in supersaturation, whereby a single crystal containing the given element as a constituting element is selectively and epitaxially grown in the perpendicular direction to the surface of the single crystalline substrate from the seed crystal part and thereby, a single crystalline member is produced.

In this way, in this invention, the seed crystal part is formed on the surface of the single crystalline substrate and then, the single crystalline member is obtained through the selective epitaxial growth in the perpendicular direction from the seed crystal.

Thus, by appropriately selecting the size and shape of the seed crystal part, the cross sectional shape of the single crystal member to be obtained is determined. Then, by appropriately controlling the selective epitaxial growth in the perpendicular direction to the surface of the single crystalline substrate, the single crystalline member having a desired size and shape can be obtained.

According to the present invention, the single crystalline member having a desired size and shape can be obtained by only the selective epitaxial growth. Thus, since in employing such a single crystalline member for a single crystalline substrate, the single crystalline substrate having a desired size and shape can be directly obtained, the conventional cutting process and polishing process is not needed.

Thus, the problems such as the loss of the part of the single crystal and the formation of the fractured layer in cutting the single crystal can be avoided. Moreover, a complex machine is not needed and the producing process of the desired single crystalline member can be simplified.

Furthermore, in the producing method of the present invention, since the single crystalline member is obtained in the perpendicular direction to the surface of the substrate, even if dislocations exist in the substrate, most of the dislocations go out from the single crystalline member. Thus, the single crystalline member has little dislocations, and then, becomes almost dislocation free.

Consequently, the single crystalline member having an excellent crystallinity can be obtained without the influence of the crystallinity of the single crystalline substrate.

BRIEF DESCRIPTION OF THE DRAWINGS

For better understanding of the present invention, reference is made to the attached drawings, wherein.

DESCRIPTION OF THE PREFERRED EMBODIMENTS

FIGS. 1–4 are process charts showing a preferred embodiment in the producing method of the single crystalline member according to the present invention. This embodiment has a characteristic that the single crystalline member is grown from a window formed by selectively removing an amorphous film formed on a surface of a single crystalline substrate.

Figure 1:
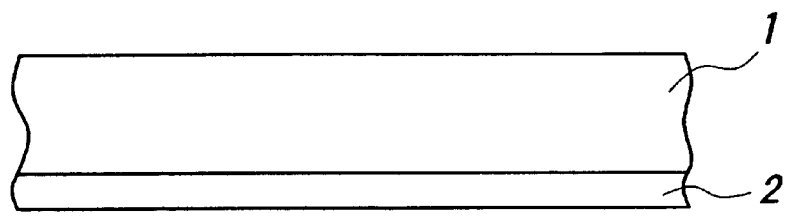
FIG. 1 is a cross sectional view showing a first step in a preferred embodiment of the producing method of the single crystalline member according to the present invention.
Figure 2:
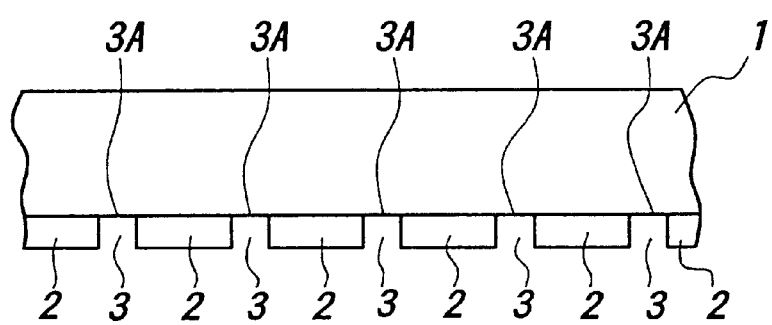
FIG. 2 is a cross sectional view showing the next step after the step of FIG. 1.

First of all, as shown in FIG. 1, an amorphous film 2 is formed on a single crystalline substrate 1 by a chemical vapor deposition (CVD) method. Then, a microfabrication technique such as photolithography is carried out for the amorphous film 2, which is partially removed in given locations to form windows 3 as shown in FIG. 2.

Figure 3:
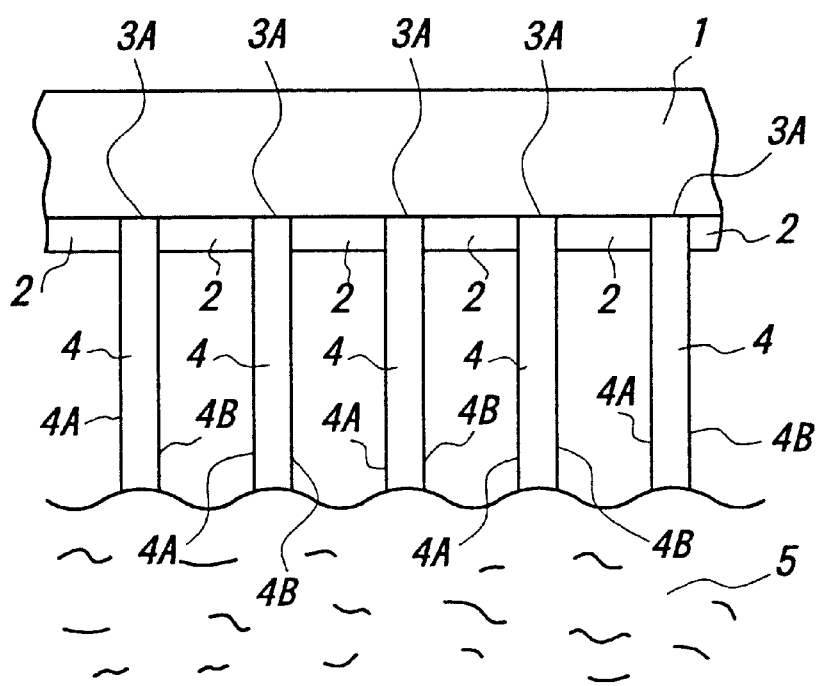
FIG. 3 is a cross sectional view showing the next step after the step of FIG. 2.

Next, the windows 3 are contacted with a supersaturated solution 5 containing a given element in supersaturation. When the supersaturated solution is cooled down gradually, as shown in FIG. 3, single crystals 4 containing the given element as a constituting element are selectively and epitaxially grown in the perpendicular direction to the surface of the single crystalline substrate 1 from the windows 3 which serve as seeds.

Figure 4:
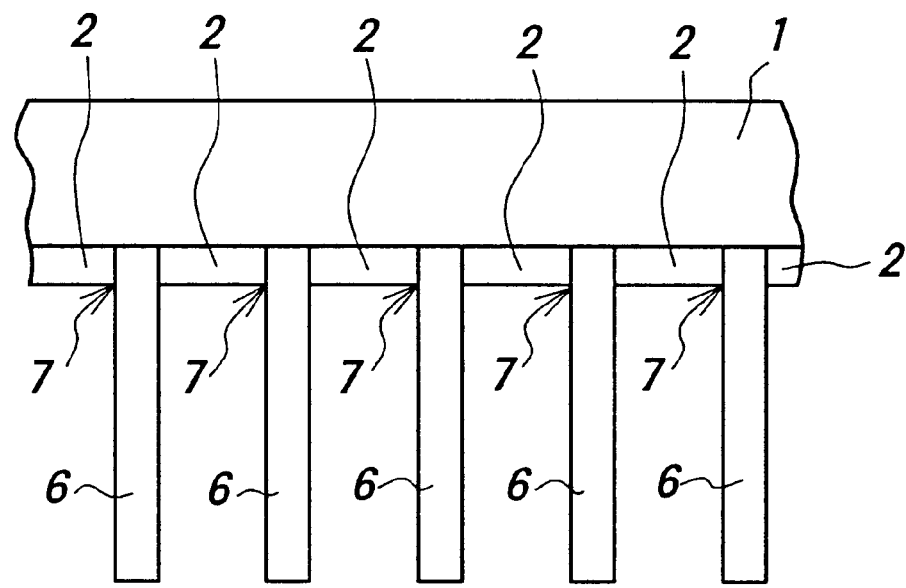
FIG. 4 is a cross sectional view showing the next step after the step of FIG. 3.

Next, after a give time elapsed, the contacting of the single crystals 4 with the supersaturated solution 5 is finished and as shown in FIG. 4, single crystalline members 6 are obtained on the surface of the single crystalline substrate 1.

When small external force is applied to the single crystalline member, it can be easily cleaved, so that separate singe crystalline members can be obtained.

The depth of the window part 3 is preferably 0.01–10 $\mu$m, more preferably 0.1–1 $\mu$m. Thereby, the window 3 can serve effectively as a seed crystal, which results in the single crystal being able to be selectively and epitaxially grown effectively.

The window 3 has to be formed so as to expose a part of the surface of the single crystalline substrate 1, as shown in FIG. 2. Thereby, since the single crystal 4 formed on the part of the surface of the single crystalline substrate 1 inherits the crystal orientation of the single crystalline substrate 1, it can be selectively and epitaxially grown, so that the single crystalline member 6 having a large size can be easily produced.

The size and shape of the bottom surface 3A of the window 3 are optionally selected, depending on the cross sectional shape and size of tile single crystalline member 6 to be obtained. In producing a single crystalline substrate directly according to the present invention, the bottom surface 3A is formed in linear shape. That is, by opening the window 3 in linear shape, the single crystalline substrate having a rectangular cross section can be directly obtained.

In forming the linear window 3 so as to expose the part of the surface of the single crystalline substrate 1, it is preferable that the long direction of the window 3 is substantially perpendicular to a crystal axis of an singular face of the single crystalline member 6 during its growth. Thereby, since facets 4A and 4B are formed in the lateral direction of the window 3 during the selective epitaxial growth of the single crystal, the epitaxial growth does not occur in the perpendicular direction to the facets, so that the single crystal is epitaxially grown in the vertical direction to the surface of the single crystalline substrate 1. Thus, the single crystalline member having the rectangular cross section can be effectively and easily produced.

For example, in the case of growing a single crystalline material having a diamond structure or a zinc-blende structure, since the crystal axis of the singular face thereof are a <111> direction and its equivalent direction or a <100> direction and its equivalent direction, the longitudinal direction of the window part 3 is formed so that the side surfaces 4A and 4B of the growing single crystalline member may have crystal orientations parallel to the <111> direction and its equivalent direction or the <100> direction and its equivalent direction.

Hereupon, the wording "singular face" means a face having the slowest growing velocity.

A single crystalline material usable for the single crystalline substrate 1 may be optionally selected, depending on the kind of the single crystalline member to be grown. In this invention, since the single crystalline member is formed through the epitaxial growth, the single crystalline material constituting the top layer of the single crystalline substrate 1 is preferably the same one as the single crystalline member 6, but is not always restricted to the same one.

For example, in the case of producing a Si single crystalline member, although the single crystalline substrate 1 can be a Si single crystal, a single crystalline material except the Si single crystal may be used if the Si single crystalline member can be epitaxially grown on the single crystalline material.

Moreover, in producing a single crystalline member of a III-V compound semiconductor, the top layer of the single crystalline substrate 1 is preferably composed of the same III-V compound semiconductor as the single crystalline member. In real case, the single crystalline substrate 1 can be the same semiconductor compound as the single crystalline member or the same III-V compound semiconductor as the single crystalline member is deposited on a given substrate. Besides, another crystalline material having a lattice constant nearly equal to that of the single crystalline member such as another III-V compound semiconductor may be employed.

Moreover, in the case of producing an oxide-single crystalline member, the top layer of the single crystalline substrate 1 is preferably composed of the same oxide as the single crystalline member. In real case, the single crystalline substrate can be the same oxide as the single crystalline member or the same oxide as the single crystalline member may be deposited on a given substrate. Besides, the single crystalline substrate 1 can be composed of semiconductor single crystal or metallic single crystal on which the single crystalline member can be epitaxially grown.

A material usable for the amorphous film 2 is not restricted. If the object of the present invention can be achieved, any material can be used for the amorphous film. For example, a silicon oxide film, a silicon nitride film, a carbon film or a tungsten film can be used as the amorphous film.

Moreover, in the case of using an oxide-single crystalline substrate in producing an oxide-single crystalline member, instead of the amorphous film, a high melting point-metallic film made of platinum, palladium or tantalum, etc. may be used.

The supersaturated solution 5 is required to contain the element to constitute the single crystalline member. For example, in the case of producing a Si single crystalline member, the supersaturated solution 5 has to contain Si element in supersaturation. In the case of producing the single crystal member of a III-V compound semiconductor, when a group III element is employed as the solvent of the supersaturated solution 5, the solution 5 has to contain a group V element in supersaturation. In another case, the supersaturated solution 5 has to contain a group III element and a group V element in supersaturation.

Then, the supersaturated solution 5 is produced by solving the Si element, etc. in a given solvent. As the solvent materials Sn, In, Ga, Au, Bi, etc. can be used.

There is no restriction for the selective epitaxial growth of the single crystal 4. However, a travelling heater method or a gradient freeze method can be preferably used. According to these methods, a positive temperature gradient is applied to the single crystal 4 with respect to the supersaturated solution 5. Thus, compositional supercooling can be suppressed, which occurs typically in solution growth and the single crystalline member having a desired size and shape can be easily produced.

Figure 5:
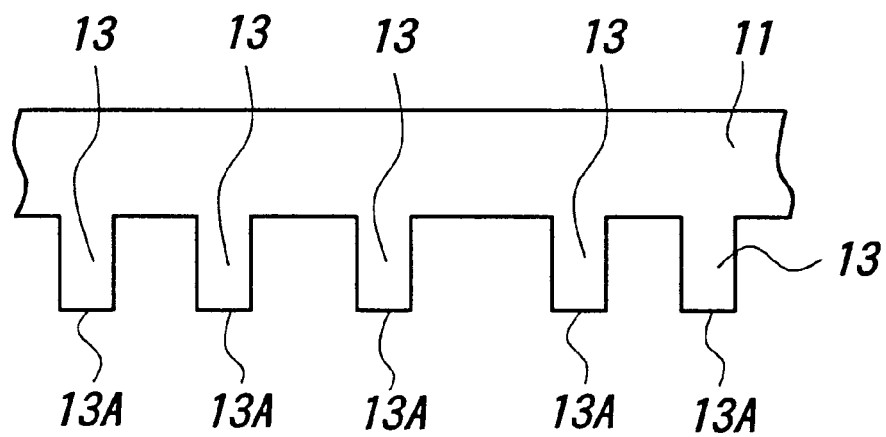
FIG. 5 is a cross sectional view showing a first step in another preferred embodiment of the producing method of the single crystalline member according to the present invention.
Figure 6:
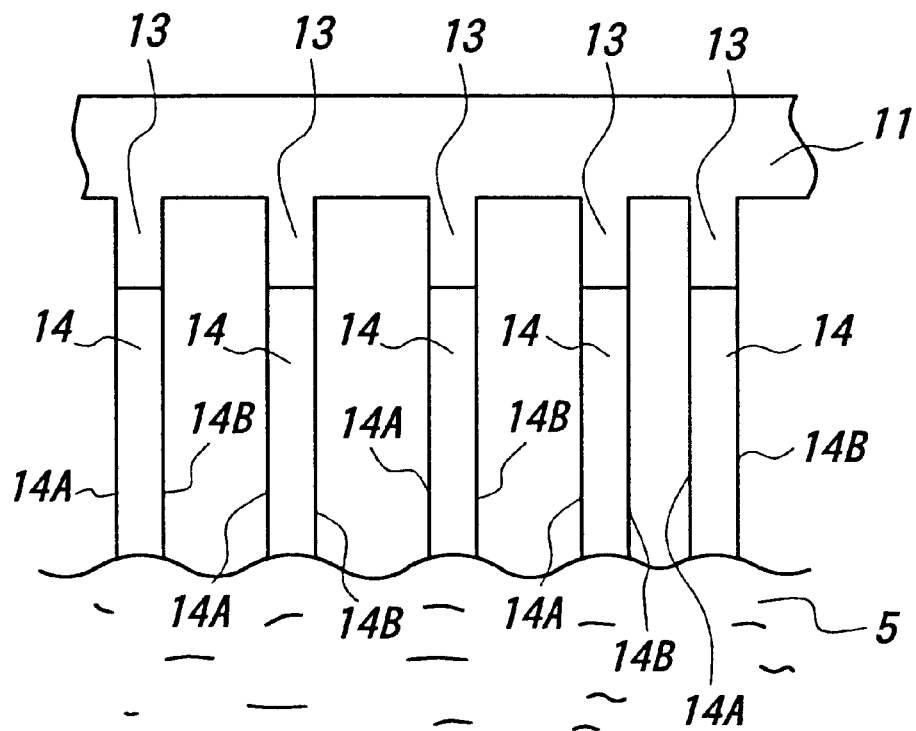
FIG. 6 is a cross sectional view showing the next step after the step of FIG. 5.
Figure 7:
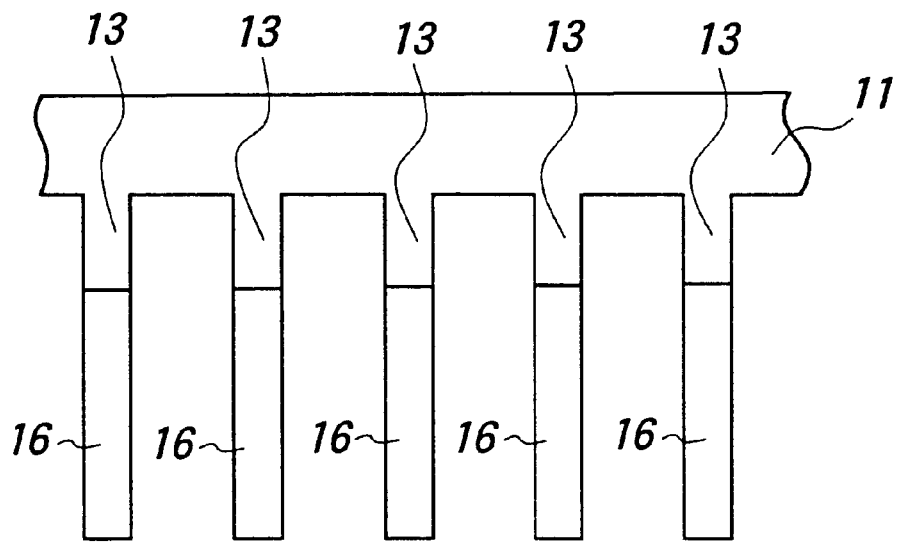
FIG. 7 is a cross sectional view showing the next step after the step FIG. 6.

FIGS. 5–7 give process charts showing another producing method of the single crystalline member according to the present invention. In this method, the seed crystal is cut to form rectangular convex portions as shown in FIG. 5.

In this method, first of all, photolithography and etching, etc. are carried out for a surface of a single crystalline substrate 11 to remove the surface partially and form rectangular convex portions 13 as shown in FIG. 5. Next, the convex portions 13 are contacted with a supersaturated solution 5 containing a given element in supersaturation. Then, as the supersaturated solution is cooled down gradually, as shown in FIG. 6, single crystals 14 containing the given element as a constituting element are selectively and epitaxially grown in the perpendicular direction to the surface of the single crystalline substrate 11 from the convex portions which serve as seeds.

Subsequently, when the contacting of the supersaturated solution 5 is finished after a given time elapsed, as shown in FIG. 7, single crystalline members 16 are obtained on the surface of the single crystalline substrate 11.

The height of the convex portion 13 is preferably 10 $\mu$m–5 mm, more preferably 10 $\mu$m–1 mm. Thereby, the convex portion 13 can operate as a seed, so that the selective epitaxial growth of the single crystal 14 can be effectively performed and the single crystalline member 16 having a large size can be easily produced.

The size and shape of tile top surface 13A of the convex portion 13 is determined, depending on the size and cross sectional shape of the single crystalline member to be obtained. However, to obtain a single crystalline substrate directly according to the present invention, the top surface 13A should preferably have long rectangular shape. That is, by employing such convex portion the single crystalline substrate having a rectangular cross section can be produced directly.

Moreover, in producing such a longitudinal convex portion, due to the similar reason to the formation of the window previously described, it is preferable that the longitudinal direction of the convex portion is substantially perpendicular to a normal direction of a singular face of the single crystal 14.

As a material usable for the single crystalline substrate 11, tile same material as that in the embodiment shown in FIGS. 1–4 may be used. As a concrete means to selectively and epitaxially grow the single crystal 14, the same means as that in the above embodiment may be used. Examples:

This invention is described on tile following examples, but is not restricted to the examples.

EXAMPLE 1

In the following example, the growth was carried out through the process shown in FIGS. 1–4.

As tile single crystalline substrate 1, a GaAs (100) single crystalline substrate having a 0.4 mm thickness was used. Then, the amorphous film 2 made of $SiO_2$ was formed in a 0.4 $\mu$m thickness on the single crystalline substrate 1 by CVD. Next, the amorphous film 2 was selectively removed by photolithography to form linear, longitudinal window parts 3. Each of the window parts 3 had a 3 cm length and a 0.3 mm width.

Subsequently, the window parts 3 were contacted with the supersaturated solution 5 composed of Ga metallic solvent containing As element in supersaturation at 750° C. Then, the supersaturated solution 5 was cooled down gradually to selectively and epitaxially grow the GaAs single crystals 4 from the window parts 3.

After 20 hours, the epitaxial growing was stopped by finishing the contact of the window parts with the supersaturated solution and GaAs single crystalline members were obtained. Each of the GaAs single crystalline member had a 2 cm length, a 3 cm width and a 0.3 mm thickness.

When the crystallinity of the GaAs single crystalline member was characterized by a X-ray topograph method, it turned out that the grown members have almost no dislocations and have good crystallinity.

EXAMPLE 2

In the following example, the growth was carried out through the process shown in FIGS. 5–7.

As the single crystalline substrate 1, a GaAs (100) single crystalline substrate having a 0.4 mm thickness was used as in Example 1. Then, the single crystalline substrate 11 was selectively etched by photolithography techniques to form linear, longitudinal convex portions 13 with rectangular cross section. Each of the convex portions had a 0.1 mm height and the top surface of the convex portion had a 3 cm length and a 0.3 mm width, respectively.

Subsequently, the convex portions 13 were contacted with the supersaturated solution 5 composed of Ga metallic solvent containing As element at 750° C. Then, the supersaturated solution was cooled down gradually to selectively and epitaxially grow the GaAs single crystals 14 from the convex portions 13.

After 20 hours, the epitaxial growth was stopped by finishing the contact of the convex portions with the supersaturated solution and GaAs single crystalline members were obtained. Each of the GaAs single crystalline member had a 2 cm length, a 3 cm width and a 0.3 mm thickness.

When the crystallinity of the GaAs single crystal member was characterized by a X-ray topograph method, it turned out that the grown members have almost no dislocations and have good crystallinity.

As is apparent from Examples 1 and 2, the single crystalline member produced according to the present invention turns out having almost no dislocations and good crystallinity. Moreover, the plate-like single crystalline member can be obtained through only the epitaxial growth without cutting and polishing, so that the single crystalline member can be used as a single crystalline substrate.

Although the present invention was described in detail with reference to the above examples, this invention is not limited to the above disclosure and every kind of variation and modification may be made without departing from the scope of the present invention.

As is explained above, according to the present invention, the single crystalline member which have almost no dislocations and have good crystallinity can be obtained in a desired size and shape through only the selective epitaxial growth. Thus, without cutting and polishing, the single crystalline member usable for a single crystalline substrate can be easily obtained through only the epitaxial growth.

What is claimed is:

1. A method for producing a single crystalline member, comprising the steps of:

preparing a single crystalline substrate, forming a seed crystal part on a surface of the single crystalline substrate, and contacting the seed crystal part with a solution containing a given element in supersaturation, whereby a single crystal containing the given element as a constituting element is selectively and epitaxially grown, by one of a traveling heater method and a temperature gradient freeze method, in the perpendicular direction to the surface of the single crystalline substrate from the seed crystal part and thereby, a single crystalline member is produced.

2. A method for producing a single crystalline member as defined in claim 1, wherein the seed crystal part is composed of a window which is formed by selectively removing an amorphous film formed on the surface of the single crystalline substrate so as to expose the part of the surface of the single crystalline substrate.

3. A method for producing a single crystalline member as defined in claim 2, wherein the window is linear.

4. A method for producing a single crystalline member as defined in claim 3, wherein the window is formed so that its long direction is almost perpendicular to a crystal axis of a singular face of the single crystalline member during its growth.

5. A method for producing a single crystalline member as defined in claim 1, wherein the seed crystal part is composed of a convex portion formed on the surface of the single crystalline substrate.

6. A method for producing a single crystalline member as defined in claim 5, wherein the convex portion is linear.

7. A method for producing a single crystalline member as defined in claim 6, wherein the convex portion is formed so that its long direction is almost perpendicular to a crystal axis of a singular face of the single crystalline member during its growth.

8. A method for producing a single crystalline member as defined in any one of claims 1–7, wherein the single crystalline substrate is a Si single crystalline substrate and the single crystalline member is a Si single crystal.

9. A method for producing a single crystalline member as defined in any one of claims 1–7, wherein the single crystalline substrate has a group III-V semiconductor compound in its surface part and the single crystalline member is made of the group III-V semiconductor compound.

10. A method for producing a single crystalline member as defined in any one of claims 1–7, wherein the single crystalline substrate has an oxide in its surface part and the single crystalline member is made of the oxide.

* * * * *